(12) United States Patent
Waltrich

(10) Patent No.: US 12,402,239 B2
(45) Date of Patent: Aug. 26, 2025

(54) ELECTRONIC DEVICE

(71) Applicant: Rolls-Royce Deutschland Ltd & Co KG, Blankenfelde-Mahlow (DE)

(72) Inventor: Uwe Waltrich, Forchheim (DE)

(73) Assignee: ROLLS-ROYCE DEUTSCHLAND LTD & CO KG, Blankenfelde-Mahlow (DE)

( * ) Notice: Subject to any disclaimer, the term of this patent is extended or adjusted under 35 U.S.C. 154(b) by 224 days.

(21) Appl. No.: 18/274,376

(22) PCT Filed: Jan. 21, 2022

(86) PCT No.: PCT/EP2022/051365
§ 371 (c)(1),
(2) Date: Jul. 26, 2023

(87) PCT Pub. No.: WO2022/161868
PCT Pub. Date: Aug. 4, 2022

(65) Prior Publication Data
US 2024/0098872 A1 Mar. 21, 2024

(30) Foreign Application Priority Data
Jan. 30, 2021 (DE) .................. 10 2021 000 469.8

(51) Int. Cl.
*H05K 1/02* (2006.01)
(52) U.S. Cl.
CPC ..... *H05K 1/0201* (2013.01); *H05K 2201/066* (2013.01)
(58) Field of Classification Search
CPC .......................................... C08K 3/36

USPC .......................................... 174/255
See application file for complete search history.

(56) References Cited

U.S. PATENT DOCUMENTS

| 4,503,485 A | 3/1985 | Geissler |
| 5,986,218 A | 11/1999 | Muto et al. |
| 6,504,110 B1 | 1/2003 | Kusukawa et al. |
| 2010/0071949 A1* | 3/2010 | Murakami ............... H01G 2/06 |
| | | 174/257 |

(Continued)

FOREIGN PATENT DOCUMENTS

| DE | 2115296 A1 | 11/1971 |
| DE | 19914815 A1 | 10/2000 |

(Continued)

OTHER PUBLICATIONS

German Search Report for German Application No. DE 10 2021 000 469.8 mailed Nov. 12, 2021.

(Continued)

*Primary Examiner* — Stanley Tso
(74) *Attorney, Agent, or Firm* — Lempia Summerfield Katz LLC

(57) ABSTRACT

The disclosure relates to an electronic device including a thermally and electrically conductive transmission element configured to dissipate heat from a heat source, wherein the transmission element is at a first electric potential and includes rounded edges. The electronic device further includes a heat sink at a second electric potential and an electrically insulating layer arranged between the heat sink and the transmission element in order to connect the transmission element to the heat sink in a thermally conductive manner.

15 Claims, 4 Drawing Sheets

(56) References Cited

U.S. PATENT DOCUMENTS

2016/0079143 A1* 3/2016 Sakamoto ........... H01L 23/3675
                                              438/122
2019/0206783 A1* 7/2019 Kim .................. H01L 23/49827

FOREIGN PATENT DOCUMENTS

DE         10117775 A1   10/2002
DE     102019214998 A1    4/2021

OTHER PUBLICATIONS

International Search Report and Written Opinion for International Application No., PCT/EP2022/051365 mailed May 30, 2022.

* cited by examiner

ELECTRONIC DEVICE

The present patent document is a § 371 nationalization of PCT Application Serial No. PCT/EP2022/051365, filed Jan. 21, 2022, designating the United States, and this patent document also claims the benefit of German Patent Application No. 10 2021 000 469.0, filed Jan. 30, 2021, which are incorporated by reference in their entireties.

TECHNICAL FIELD

The disclosure relates to an electronic device including a thermally and electrically conductive transmission element for dissipating heat from a heat source, a heat sink, and an electrically insulating layer arranged between the heat sink and the transmission element in order to thermally conductively connect the heat source to the heat sink.

BACKGROUND

Devices of the type mentioned at the outset are used for dissipating heat from electronic component parts, in particular for dissipating and distributing heat from chips or circuit carriers, in particular printed circuit boards (PCBs). The chips or circuit carriers may be separated from the actual heat sink, (e.g., a structure with cooling ribs), by an electrically insulating and thermally conductive layer, (e.g., heat-conducting pads or heat-conducting adhesive). The heat is dissipated from the chip, the heat source, via an electrically and thermally conductive transmission element. Because a considerable potential difference (higher than 1 kV) may exist between the PCB/chip and the heat sink, which is normally at ground potential, a strong electrical field forms between the two component parts. Inhomogeneities in the electrical field may result in local partial discharges occurring that may damage the insulator material and the chip/PCB.

SUMMARY AND DESCRIPTION

The disclosure has the object of at least diminishing these disadvantages.

The scope of the present disclosure is defined solely by the appended claims and is not affected to any degree by the statements within this summary. The present embodiments may obviate one or more of the drawbacks or limitations in the related art.

In accordance with the disclosure, an electronic device of the type mentioned at the outset is created, wherein the transmission element has rounded-off edges.

As a consequence of the potential difference between the transmission element, the heat source coupled thereto and the heat sink, an electrical field is formed in the interspace between the transmission element and the heat sink. The local strength of the electrical field is in this case dependent on the distance between the potential-affected areas and on the geometry of the surfaces from where the electrical lines of force emerge. The smallest radius defines the maximum field strength, and therefore high field strengths occur in the case of a potential difference between the transmission element and the heat sink at small radii of the surface geometry. The smallest radii occur at sharp edges of the transmission element that are oriented in the direction of the heat sink and are caused by the manufacture. Therefore, there is a particularly high risk of partial discharges and therefore of damage to the insulation materials at the edges. Partial discharges take place as a result of field inhomogeneities that have the effect that, locally, the dielectric strength of an insulation material is exceeded, and electrical charge carriers flow through the electrically insulating material of the insulating layer and damage it. Owing to the rounding-off of those edges of the transmission element that face the heat sink and therefore another electrical potential, (e.g., ground potential), the smallest radii are increased in size. As a result, local excessive increases in the electrical field strength are avoided and the risk of pre-existing damage or ageing of insulation materials, (e.g., in the form of partial discharges), is reduced. As a result, it is also possible to reduce a minimum thickness of the insulating layer, which is otherwise necessary for safely preventing partial discharges. As a result, the thermal resistance of the layer may be reduced and physical space and weight may be saved on the system side.

In one configuration, the transmission element is arranged at least partially within the insulating layer, and/or those edges of the transmission element arranged within the insulating layer are rounded off.

In particular, those edges of the transmission element that face the heat sink and run at least partially in a plane parallel to an area of the heat sink, which is opposite the transmission element, are rounded off.

Advantageously, those edges, which are oriented in the direction of the second potential, the electrical potential of the heat sink, and which lie within the insulating layer, are rounded off because the electrical field is formed between the transmission element and the heat sink. Because, in addition to the radius of the edges, the distance between the edges and the heat sink potential is also critical for the local field strength, a rounding-off of the edges lying next to the heat sink potential is the most effective. The transmission element may be arranged at least partially in the insulating layer or may reach into the insulating layer.

In one configuration, the transmission element includes a thermal connection pad of a PCB and a heat spreader, wherein the heat spreader has rounded-off edges and is arranged between the thermal connection pad and the insulating layer.

An additional, electrically and thermally conductive heat spreader between the connection pad (pre-package) and the insulating layer (heat-conducting pad) acts as a shield for shielding excessively high electrical field strengths that occur at the sharp edges of the connection pad. The sharp edges of the connection pad may be caused by the production. The heat spreader has rounded-off edges, wherein the edges are rounded off in the direction of the heat sink, (e.g., in the direction of the other electrical potential), in order to diminish excessively high field strengths. In this configuration, the heat spreader may be fitted directly onto the connection pad of the PCB, wherein the connection pad of the PCB therefore does not need to have any rounded-off edges. Advantageously, therefore, the connection pads of conventional PCBs may be equipped with the heat spreaders, as a result of which a post-treatment of the PCB may be dispensed with.

In one configuration, the edges of the transmission element are rounded in accordance with Borda and/or Rogowski profiles. Borda and/or Rogowski profiles have the advantage that the excessive electrical field strength increases in the periphery region are avoided. The geometry of the profiles enables a precise determination of the course of the lines of force and therefore a prediction of the field properties over a certain distance (in the insulating layer). If Rogowski profiles are used, electrical fields are decayed homogeneously, which contributes to preventing local field strength peaks and therefore partial discharges. If Borda profiles are used, the electrical field is kept constant.

In one configuration, the transmission element is a thermally and electrically conductive connection pad of a PCB, and/or the edges are rounded off by an electrically conductive coating. In particular, the electrically conductive coating forms a rounded-off edge structure. The roundings of the edges of the transmission element may also be produced retrospectively by a casting compound or coating with good electrical conductivity. The effects with respect to the reduced risk of partial discharges are then the same as described above. With further advantage, a rounded-off connection pad may be introduced into the insulating layer more easily. Connection pad and insulating layer (e.g., the heat-conducting pad) may be at least partially connected to one another by a press fit. During the press fit, however, damage may be produced in the heat-conducting pad or at the connection pad by the sharp edges. The risk of this damage is likewise reduced by rounded-off edges. This applies to all embodiments of the present disclosure.

In one configuration, the transmission element is a thermally and electrically conductive connection pad of a PCB, and the edges of the connection pad are rounded off by an electrically nonconductive coating. In particular, the electrically nonconductive coating forms a rounded-off edge structure which surrounds the edges of the connection pad, wherein the nonconductive coating has a high dielectric constant.

Owing to the fact that an electrically insulating material with increased dielectric strength is applied, the critical radius of the edges of the connection pad is encapsulated by casting and insulated. The dielectric material may have a high dielectric constant compared to the insulating layer. This results in a shift in the electrical field into the material having a lower dielectric constant, namely into the insulating layer. Therefore, the field strength peaks are "pushed away" from the sharp edges of the connection pad. As a result, the risk of excessive field strength increases decreases at these edges.

In one configuration, the transmission element includes a connection pad and a magnetoresistor, wherein the magnetoresistor is positioned on the connection pad and is arranged between the connection pad and the insulating layer, wherein ends of the magnetoresistor are bent in the direction of the connection pad in such a way that a rounding is produced in the direction of the heat sink.

The rounded edge structure may also be formed by a bent magnetoresistor positioned as shielding element on the connection pad. The difference with respect to the preceding embodiments is that the magnetoresistor forms a heat spreader having a considerably reduced thickness and whose roundings are not formed by removal or addition of material of a solid body but are formed by bending of the magnetoresistor. As a result, material is saved. With further advantage, the magnetoresistor may easily be soldered to the connection pad retrospectively. The pointed ends of the magnetoresistor have an enlarged distance from the opposite electrical potential of the heat sink owing to the bending/curvature. The pointed ends may also be bent inwards and may thus be shielded from the electrical potential of the heat sink.

Owing to the fact that the electrical field strength is also a function of the distance from the reference potential, the risk of partial discharges is reduced not only by the rounding but also by the increased distance between the ends of the magnetoresistor and the reference potential. Therefore, the present embodiment is particularly well suited to very high potential differences (=high field strengths).

In one configuration, the heat sink has a region with a geometric structure that corresponds to the mirror image of a geometric structure of the transmission element and is opposite the latter, e.g., wherein the region is formed by a platform facing the heat source and having rounded-off edges. By virtue of the mirror-image formation of the heat sink, or of a region of the heat sink facing the heat source, covered by the insulating layer and opposite the transmission element, the electrical field may be homogenized overall. A more homogeneous electrical field has fewer inhomogeneities and therefore fewer regions in which partial discharges may occur, however. This feature is compatible with and may be combined effectively with all embodiments of the disclosure.

BRIEF DESCRIPTION OF THE DRAWINGS

Exemplary embodiments of the disclosure are described in more detail below with reference to the appended drawings. In the drawings.

DETAILED DESCRIPTION

Figure 1:
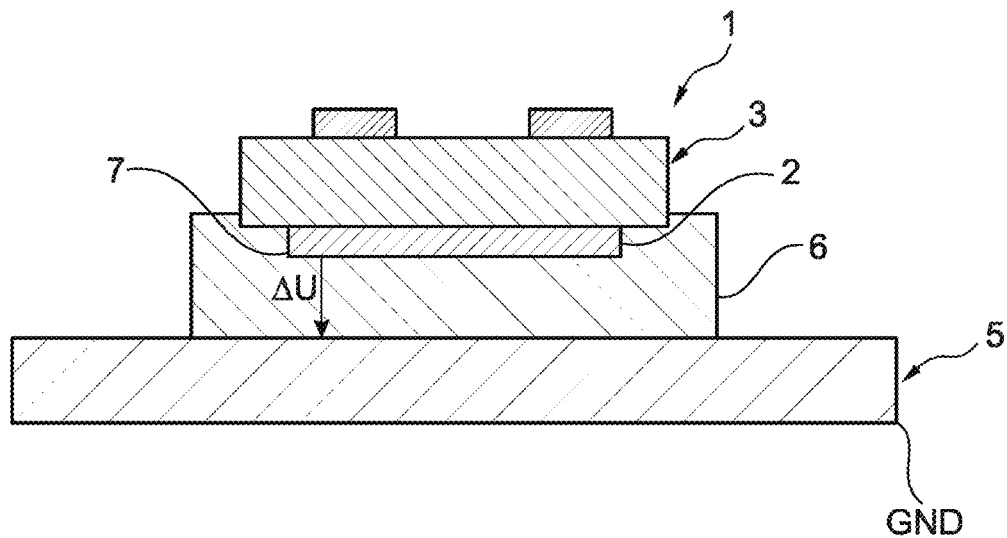
FIG. 1 depicts an electronic device of the generic type from the prior art.

FIG. 1 shows an electronic device 1 of the generic type from the prior art. The electronic device 1 includes a thermally and electrically conductive transmission element 2 connected to a heat source 3, in this case, a printed circuit board (PCB). The transmission element 2 is formed by a connection pad 4 of the PCB 3. The electronic device 1 includes a heat sink 5 at GND potential. The transmission element 2 is at a potential that is elevated in comparison with GND. The heat sink 5 and the transmission element 2 are spaced apart from one another by an electrically insulating layer 6. The material of the electrically insulating layer is thermally conductive, however, in order to enable a heat transfer from the heat source 3 through the transmission element 2 and through the electrically insulating layer 6 to the heat sink 5. The connection pad 2 is arranged within the insulating layer 6. The connection pad has sharp edges 7. The edges 7 face the heat sink 5 and run perpendicular to the plane of the image.

Figure 2:
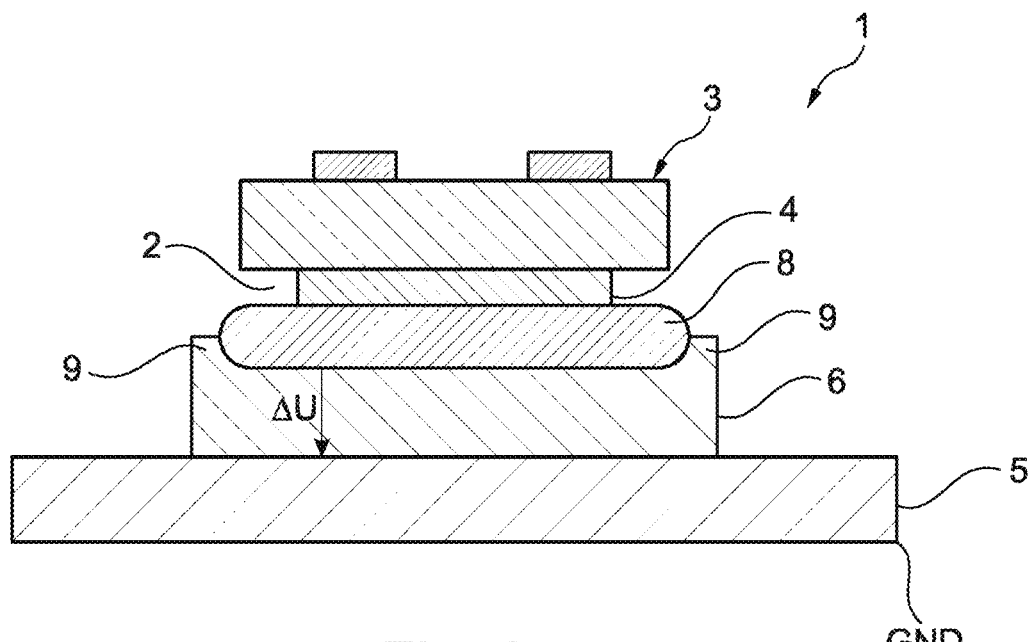
FIG. 2 depicts a first exemplary embodiment of an electronic device.

FIG. 2 shows a first exemplary embodiment of the electronic device 1. The transmission element 2 includes the connection pad 4 and a heat spreader 8. The heat spreader 8 includes an electrically conductive material and is connected to the connection pad 4. Connection pad 4 and heat spreader are at the same electrical potential, which is elevated in comparison with GND. The heat spreader 8 is arranged at least partially within the electrically insulating layer 6 and has rounded-off edges 9. The heat spreader 8 also has a larger base area than the connection pad 4. The heat spreader 8 therefore protrudes beyond the connection pad. The protruding edges 9 of the heat spreader 8 are rounded off. Only those rounded-off edges 9 of the heat spreader 8 that are oriented towards the heat sink 5 are embedded in the electrically insulating layer 6 and surrounded thereby. The roundings of the rounded-off edges 9 of the heat spreader 8 may have the geometry of Borda or Rogowski profiles.

Figure 3:
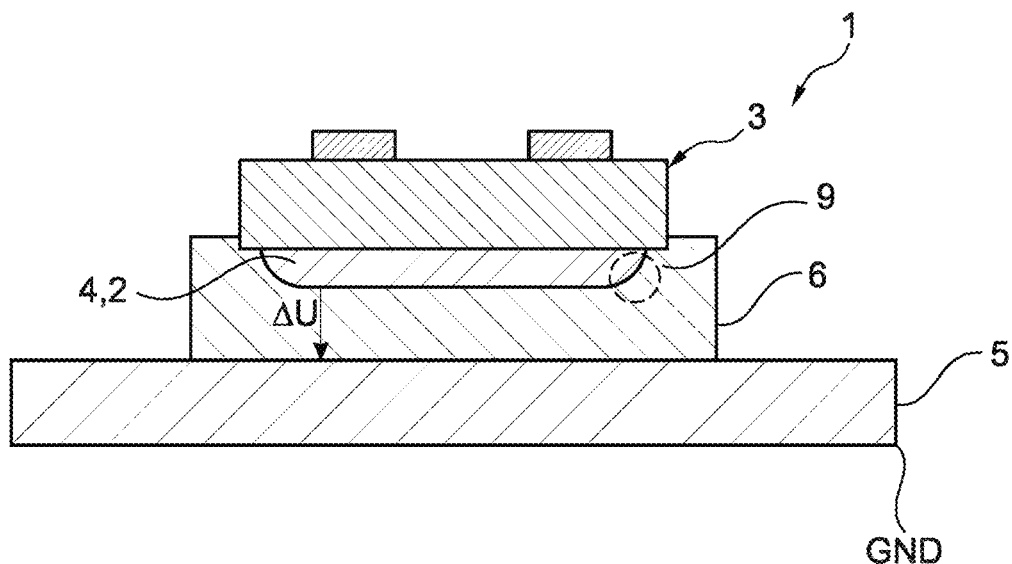
FIG. 3 depicts a further exemplary embodiment of an electronic device.

FIG. 3 shows a second exemplary embodiment of the electronic device 1. In contrast to the first embodiment, the transmission element 2 does not have a dedicated heat spreader 8. Instead, the connection pad 4 of the PCB 3 acts as heat spreader 8. The connection pad 4 is arranged in the insulating layer 6, and the sharp (owing to the production) edges 7 of the connection pad 4 are rounded off, with the result that the connection pad 4 now has rounded-off edges 9. The rounded-off edges 9 point into the plane of the image and are oriented towards the heat spreader 8.

Figure 4:
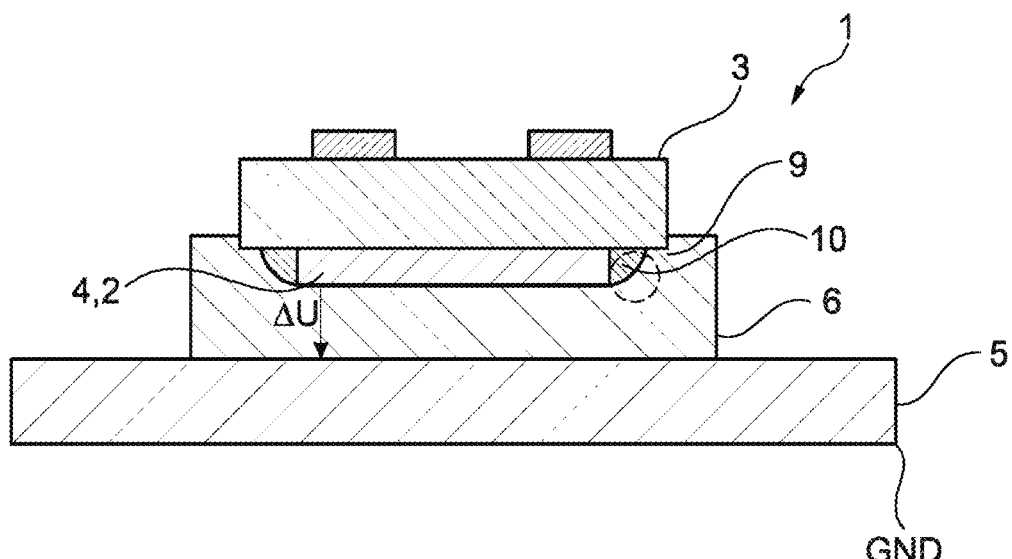
FIGS. 4, 5, 6, and 7 depict further exemplary embodiments of an electronic device.

FIG. 4 shows a further exemplary embodiment of the electronic device 1. The rounded-off edges 9 of the connection pad 4 are produced by an electrically conductive coating 10, with which the connection pad 4 is coated prior to being connected to the electrically conductive layer 6. The rounded-off edges 9 produced in this way may also have the geometry of Borda or Rogowski profiles.

Figure 5:
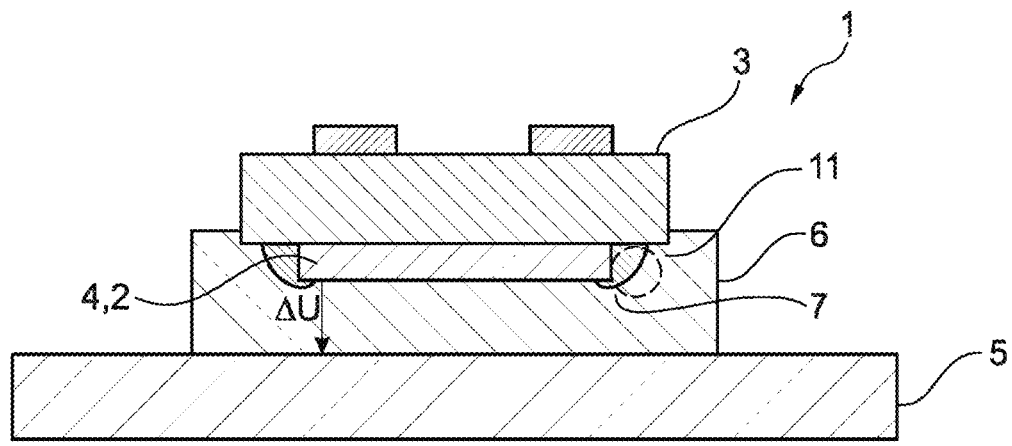

FIG. 5 shows a further exemplary embodiment of the electronic device 1. The rounded-off edges 9 of the connection pad 4 are produced by an electrically nonconductive coating 11, with which the connection pad 4 is coated prior to being connected to the electrically conductive layer 6. In this case, the sharp edges 7 of the connection pad 4 are encapsulated by casting and additionally insulated. The sharp edges 7 are completely surrounded by the material. The material of the electrically nonconductive coating 11 has a high dielectric constant. In any case, it has a higher dielectric constant and therefore a higher dielectric strength than the material of the insulating layer 6.

Figure 6:
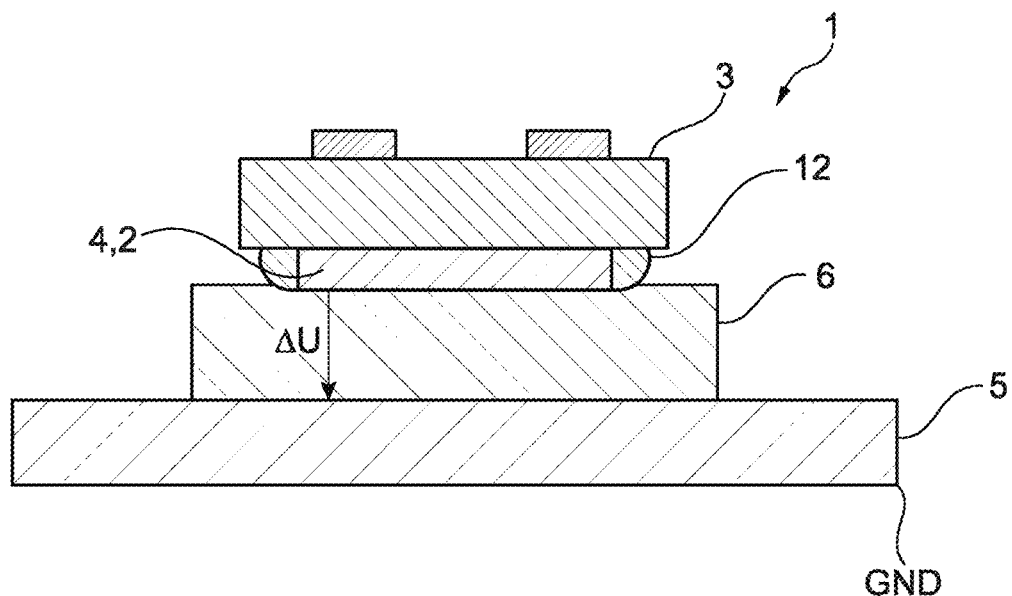

FIG. 6 shows a further exemplary embodiment of the electronic device 1. The transmission element 2 includes the connection pad 4 and an electrical magnetoresistor 12. The magnetoresistor 12 has been soldered to the connection pad 4. The ends of the magnetoresistor 12 are bent in the direction of the heat source 3 ("upwards" in the drawing), with the result that a rounding is produced in the direction of the heat sink 5. This rounding has the same effect as the rounded edges 9 of the heat spreader 8 or the connection pad 4. The roundings thus produced may likewise be shaped in accordance with Borda or Rogowski profiles.

Figure 7:
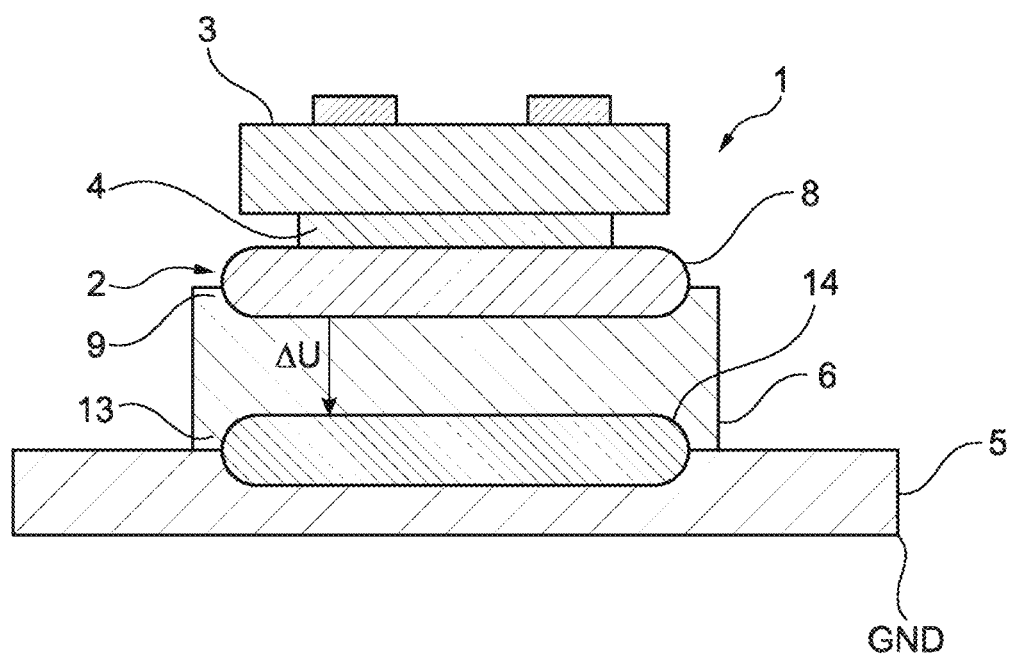

FIG. 7 shows a further exemplary embodiment of the electronic device 1. The heat sink 5 has a structured region 13 which is opposite an underside of the transmission element 2 and is formed in mirror-image fashion with respect to a geometry of the underside of the transmission element 2. The structured region 13 is in the form of a raised platform and likewise has rounded edges 14. The rounded edges 14 are embedded in the insulating layer 6. This embodiment is compatible with all of the abovementioned embodiments.

It is to be understood that the elements and features recited in the appended claims may be combined in different ways to produce new claims that likewise fall within the scope of the present disclosure. Thus, whereas the dependent claims appended below depend on only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

LIST OF REFERENCE SIGNS

1 electronic device
2 transmission element
3 PCB/heat source
4 connection pad
5 heat sink
6 electrically insulating layer
7 sharp edges of the connection pad
8 heat spreader
9 rounded-off edges of the transmission element
10 electrically conductive coating
11 electrically nonconductive coating
12 magnetoresistor
13 structured region
14 rounded edges of the structured region

The invention claimed is:

1. An electronic device comprising:
a thermally and electrically conductive transmission element configured to dissipate heat from a heat source, wherein the transmission element is at a first electrical potential;
a heat sink that is at a second electrical potential; and
an electrically insulating layer arranged between the heat sink and the transmission element,
wherein the electrically insulating layer is configured to thermally conductively connect the transmission element to the heat sink, and
wherein the transmission element has rounded-off edges.

2. The electronic device of claim 1, wherein the transmission element is arranged at least partially within the electrically insulating layer; and/or
wherein edges of the transmission element arranged within the electrically insulating layer are rounded off, wherein the rounded-off edges of the transmission element face the heat sink and run at least partially in a plane parallel to an area of the heat sink that is opposite the transmission element.

3. The electronic device of claim 2, wherein the transmission element comprises a thermal connection pad of a printed circuit board (PCB) and a heat spreader,
wherein the heat spreader is arranged between the thermal connection pad and the electrically insulating layer, and
wherein the heat spreader has the rounded-off edges.

4. The electronic device of claim 3, wherein the edges of the transmission element are rounded in accordance with Borda and/or Rogowski profiles.

5. The electronic device of claim 4, wherein the edges of the transmission element are rounded off by an electrically conductive coating, and
wherein the electrically conductive coating forms a rounded-off edge structure.

6. The electronic device of claim 4, wherein the edges of the transmission element are rounded off by an electrically nonconductive coating,
wherein the electrically nonconductive coating forms a rounded-off edge structure that surrounds the rounded-off edges of the transmission element, and
wherein the electrically nonconductive coating has a high dielectric constant.

7. The electronic device of claim 1, wherein the transmission element comprises a connection pad and a magnetoresistor,
   wherein the magnetoresistor is positioned on the connection pad and is arranged between the connection pad and the electrically insulating layer, and
   wherein ends of the magnetoresistor are bent in a direction of the connection pad in such a way that a rounding is produced in a direction of the heat sink.

8. The electronic device of claim 1, wherein the heat sink has a region with a geometric structure that corresponds to a mirror image of a geometric structure of the transmission element,
   wherein the region of the heat sink is opposite the geometric structure of the transmission element,
   wherein the region is formed by a platform facing the heat source, and
   wherein the platform comprises rounded-off edges.

9. The electronic device of claim 1, wherein the transmission element comprises a thermal connection pad of a printed circuit board (PCB) and a heat spreader,
   wherein the heat spreader is arranged between the thermal connection pad and the electrically insulating layer, and
   wherein the heat spreader has the rounded-off edges.

10. The electronic device of claim 1, wherein the rounded-off edges of the transmission element are rounded in accordance with Borda and/or Rogowski profiles.

11. The electronic device of claim 1, wherein the rounded-off edges of the tranmission element are rounded off by an electrically conductive coating, and
    wherein the electrically conductive coating forms a rounded-off edge structure.

12. The electronic device of claim 1, wherein the rounded-off edges of the transmission element are rounded off by an electrically nonconductive coating,
    wherein the electrically nonconductive coating forms a rounded-off edge structure that surrounds the rounded-off edges of the transmission element, and
    wherein the electrically nonconductive coating has a high dielectric constant.

13. The electronic device of claim 1, wherein the rounded-off edges of the transmission element are rounded off by an electrically conductive coating or by an electrically nonconductive coating.

14. The electronic device of claim 1, wherein the transmission element is a thermally and electrically conductive connection pad of a printed circuit board (PCB), and
    wherein the thermally and electrically conductive connection pad has the rounded-off edges.

15. The electronic device of claim 14, wherein the rounded-off edges of the thermally and electrically conductive connection pad are rounded off by an electrically conductive coating or by an electrically nonconductive coating.

* * * * *